(12) United States Patent
Yamashida (10) Patent No.: US 8,963,591 B2
(45) Date of Patent: Feb. 24, 2015

(54) CLOCK SIGNAL INITIALIZATION CIRCUIT AND ITS METHOD

(71) Applicant: NEC Corporation, Tokyo (JP)

(72) Inventor: Hisashi Yamashida, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 14/067,519

(22) Filed: Oct. 30, 2013

(65) Prior Publication Data

US 2014/0118035 A1   May 1, 2014

(30) Foreign Application Priority Data

Oct. 31, 2012   (JP) ................................ 2012-239707

(51) Int. Cl.
| | | |
|---|---|---|
| H03L 7/00 | (2006.01) | |
| G11C 7/20 | (2006.01) | |
| G11C 7/22 | (2006.01) | |
| G06F 1/08 | (2006.01) | |
| H03L 7/16 | (2006.01) | |

(52) U.S. Cl.
CPC ... *G11C 7/20* (2013.01); *H03L 7/16* (2013.01); *G11C 7/222* (2013.01); *G06F 1/08* (2013.01)
USPC ........................................................ 327/143

(58) Field of Classification Search
CPC ......................................................... H03L 7/00
USPC ........................................................ 327/143
See application file for complete search history.

(56) References Cited

U.S. PATENT DOCUMENTS 5,294,894 A * 3/1994 Gebara ..................... 331/1 A

FOREIGN PATENT DOCUMENTS

| JP | 11-234125 A | 8/1999 |
|---|---|---|
| JP | 3119628 B2 | 12/2000 |
| JP | 2002-91608 A | 3/2002 |
| JP | 2004-172763 A | 6/2004 |
| JP | 2005-339310 A | 12/2005 |
| JP | 2007-52602 A | 3/2007 |
| JP | 2011-113257 A | 6/2011 |
| JP | 2013-175026 A | 9/2013 |
| WO | 99/21280 A1 | 4/1999 |

OTHER PUBLICATIONS

Japanese Office Action for JP Application No. 2012-239707 mailed on Feb. 4, 2014 with English Translation.

* cited by examiner

*Primary Examiner* — Daniel Rojas
(74) *Attorney, Agent, or Firm* — Sughrue Mion, PLLC (57) ABSTRACT

A clock signal initialization circuit capable of preventing the operating frequency of a semiconductor integrated circuit from exceeding the maximum permissible frequency determined based on the power consumption of that semiconductor integrated circuit even when the PLL circuit is in a transient state at the start-up is provided. A clock signal initialization circuit for a semiconductor integrated circuit that operates in synchronization with a clock signal generated by a PLL circuit, includes a controller that derives a clock signal having a frequency no greater than a maximum permissible frequency determined based on a power consumption of the semiconductor integrated circuit as a supply clock signal to the semiconductor integrated circuit at least until the PLL circuit becomes a locked state after power-on.

9 Claims, 6 Drawing Sheets

PRIOR ART

CLOCK SIGNAL INITIALIZATION CIRCUIT AND ITS METHOD

INCORPORATION BY REFERENCE

This application is based upon and claims the benefit of priority from Japanese patent application No. 2012-239707, filed on Oct. 31, 2012, the disclosure of which is incorporated herein in its entirety by reference.

BACKGROUND OF THE INVENTION

1. Technical Field

The present invention relates to a clock signal initialization circuit and its method, and in particular to a clock signal initialization circuit that initializes a clock signal generated by a PLL (Phase Locked Loop) circuit and its method.

2. Background Art

In recent years, semiconductor integrated circuits have increasingly become larger in scale and their operating speeds have increasingly become higher. As a result, it is a significant challenge to reduce their power consumption. The operating frequency of such semiconductor integrated circuits depends on the frequency of a clock signal generated by a PLL circuit, and it is necessary to control the operating frequency of the semiconductor integrated circuit so that the operating frequency does not exceed the maximum permissible frequency determined based on the power consumption of the semiconductor integrated circuit even when the semiconductor integrated circuit is in a transient state such as at the start-up of this PLL circuit.

Japanese Patent No. 3119628 discloses a technique for reducing the power consumption of a clock synchronization type semiconductor integrated circuit at the power-on. An example of a technique disclosed in Japanese Patent No. 3119628 is briefly explained hereinafter with reference to FIG. 5. A high-speed clock oscillator 11 for a normal operation and a low-speed clock oscillator 12 for reducing power consumption are provided. Upon power-on, a clock signal SDRAM (Synchronous Dynamic Random Access Memory) clock 16 to be supplied to an SDRAM 14, which is an example of the semiconductor integrated circuit, is switched to the low-speed clock side for a predetermined time period in a clock switching circuit 13 by using a power-on reset signal 18 that is generated by a reset IC (circuit) 15 and output through an inverting circuit 17.

Figure 5:
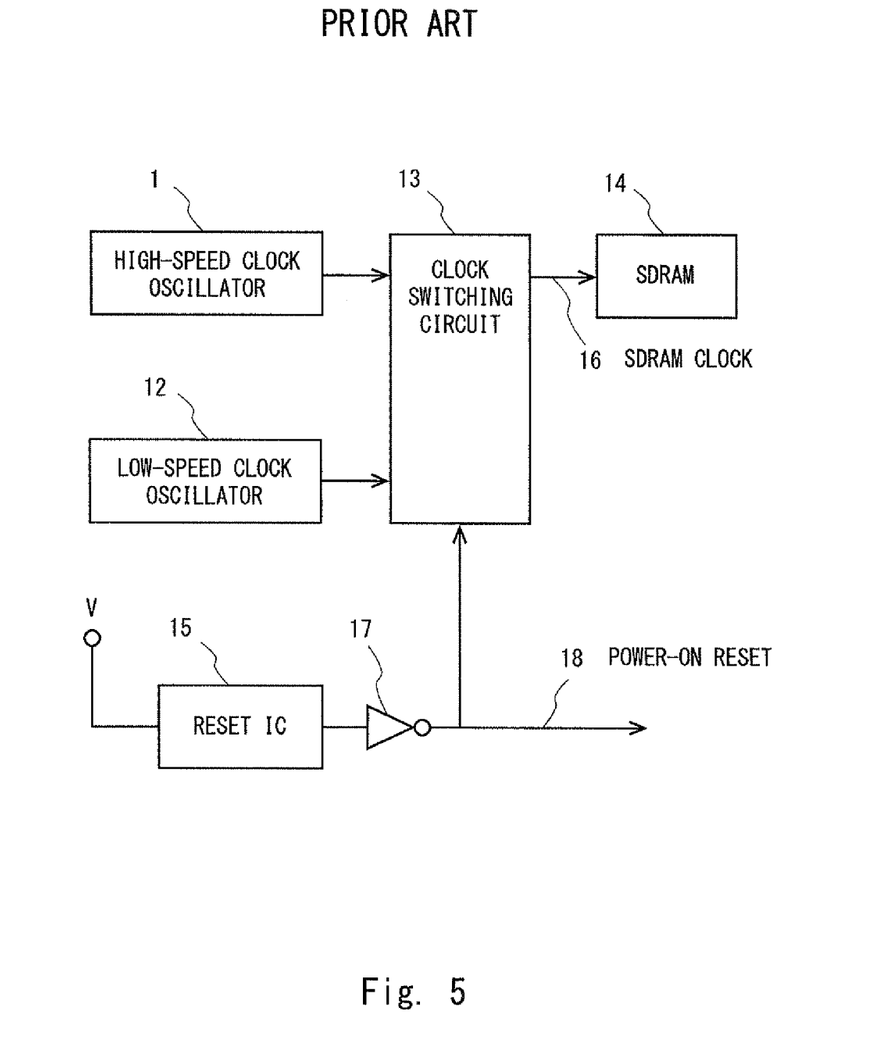
FIG. 5 shows an example of a technique relating to the present invention.
Figure 6:
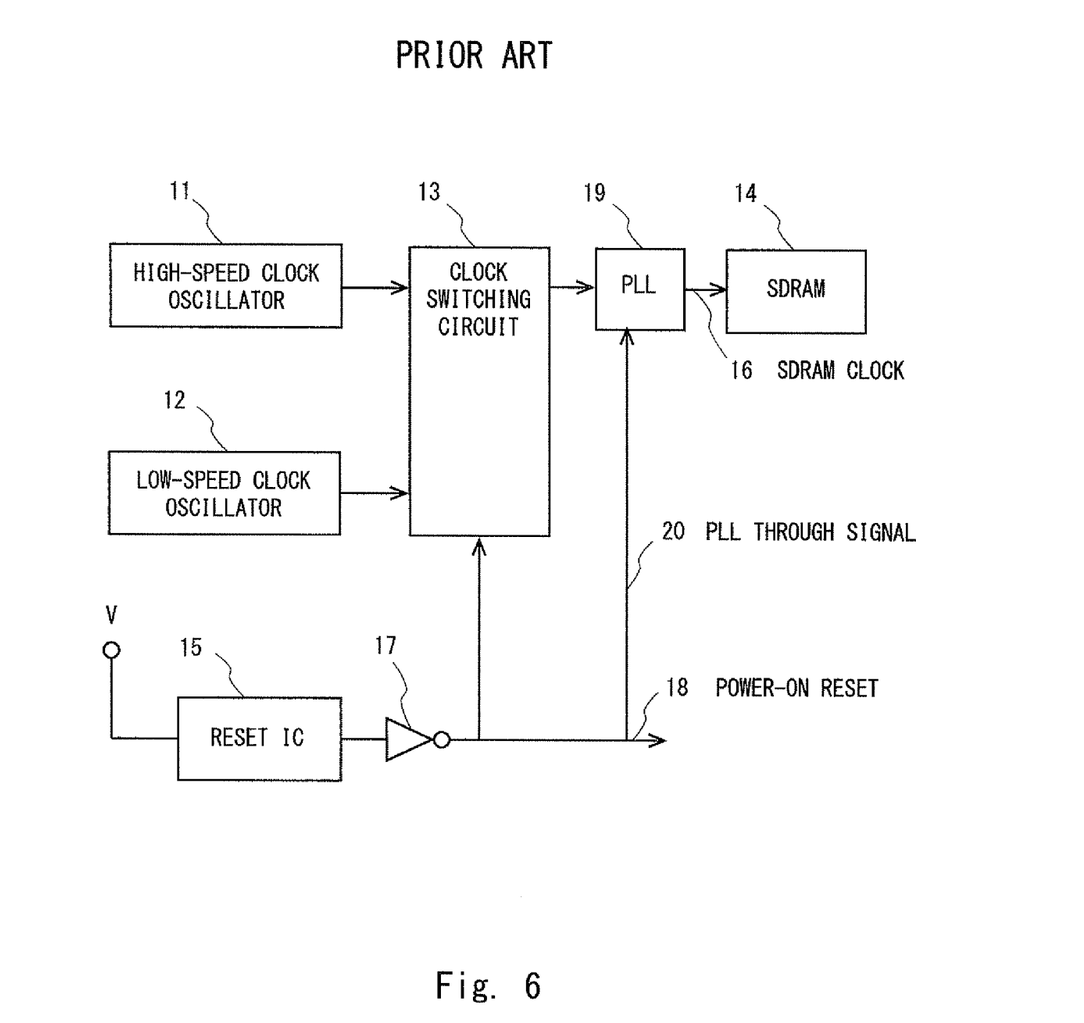
FIG. 6 shows another example of a technique relating to the present invention.

Further, an example of another technique using a PLL circuit disclosed in Japanese Patent No. 3119628 is briefly explained hereinafter with reference to FIG. 6. Note that in FIG. 6, the equivalent components/parts to those in FIG. 5 are denoted by the same symbols. In the example shown in FIG. 6, a semiconductor integrated circuit has a mode in which a PLL through signal 20 (which is also a power-on reset signal) that is used to make a low-speed clock supplied from a low-speed clock oscillator 12 pass through (bypass) a PLL circuit 19 when the low-speed clock is selected by a clock switching circuit 13 upon the power-on is enabled and the low-speed clock thereby passes through (bypasses) the PLL circuit 19.

Further, Japanese Unexamined Patent Application Publication No. 2005-339310 proposes, as a semiconductor integrated circuit capable of preventing an abrupt current consumption change from the viewpoint of the synchronous clock, a circuit that changes the frequency of a clock signal from a low frequency to a high frequency in a stepwise manner when the semiconductor integrated circuit returns from a power-on reset period or a standby state to a normal state.

That is, when the semiconductor integrated circuit returns from a power-on reset period or a standby state, the circuit changes the frequency of a clock signal from a low frequency to a high frequency in a stepwise manner by switching and controlling the output state of a frequency division circuit by using a select circuit. In doing so, the output-stabilized state of a PLL circuit is notified to an output control circuit by using a control signal. Further, until this state is notified, the output control circuit controls a clock signal for an output gate provided at the output of the output control circuit by using an output disable signal and thereby prevents any wasteful current from flowing in the transient stage (see paragraph [0035] of Japanese Unexamined Patent Application Publication No. 2005-339310).

In the technique disclosed in Japanese Patent No. 3119628, there is the following problem in the initialization process of a semiconductor integrated circuit that operates in synchronization with a clock signal generated by a PLL circuit. That is, the switching between the high-speed clock oscillator for a normal operation and the low-speed clock oscillator for reducing power consumption is performed by using the power-on reset signal.

Therefore, the frequency of a clock signal that drives the clock synchronization type semiconductor integrated circuit is set to a lower value than that for the normal operation for a predetermined time period after the power-on, and this setting is made irrelevantly to the operating state of the PLL circuit. Therefore, there is a possibility that if the PLL circuit is still in the start-up transient state and in the unlocked state at the time of switching and its clock signal is oscillating at a frequency higher than the assumed frequency range, the power consumption could increase beyond the assumed power consumption range.

The problem in the technique disclosed in Japanese Unexamined Patent Application Publication No. 2005-339310 is that the clock signal cannot be stopped when the clock signal is required to fix the reset state during the power-on reset period. On the other hand, when the clock signal is not stopped, Japanese Unexamined Patent Application Publication No. 2005-339310 does not mention any specific method for determining the frequency division ratio of the frequency division circuit that divides the frequency of the clock signal. Therefore, there is another problem that there is a possibility that the oscillating frequency in the unlocked and transient state upon the start-up of the PLL circuit could exceed the assumed frequency range even after the frequency is divided.

SUMMARY

An exemplary object of the present invention is to provide a clock signal initialization circuit capable of reliably preventing the operating frequency of a semiconductor integrated circuit from exceeding the maximum permissible frequency determined based on the power consumption of that semiconductor integrated circuit even when the PLL circuit is in a start-up unlocked state and in a transient state, and to provide its method.

In a first exemplary aspect of the invention, a clock signal initialization circuit includes:

a PLL circuit that generates a clock signal and outputs the generated clock signal as an operation clock signal for a semiconductor integrated circuit, the generated clock signal being synchronized with an externally-supplied reference clock signal; and a controller that derives a clock signal having a frequency no greater than a maximum permissible frequency determined based on a power consumption of the semiconductor integrated circuit as the operation clock signal until the PLL circuit becomes a locked state after power-on.

In a second exemplary aspect, a clock signal initialization circuit for a semiconductor integrated circuit that operates in synchronization with a clock signal generated by a PLL circuit, includes a controller that derives a clock signal having a frequency no greater than a maximum permissible frequency determined based on a power consumption of the semiconductor integrated circuit as a supply clock signal to the semiconductor integrated circuit at least until the PLL circuit becomes a locked state after power-on.

In another exemplary aspect, a clock signal initialization method for a semiconductor integrated circuit that operates in synchronization with a clock signal generated by a PLL circuit, includes deriving a clock signal having a frequency no greater than a maximum permissible frequency determined based on a power consumption of the semiconductor integrated circuit as a supply clock signal to the semiconductor integrated circuit at least until the PLL circuit becomes a locked state after power-on.

The above and other objects, features and advantages of the present invention will become more fully understood from the detailed description given hereinbelow and the accompanying drawings which are given by way of illustration only, and thus are not to be considered as limiting the present invention.

EXEMPLARY EMBODIMENT

Figure 1:
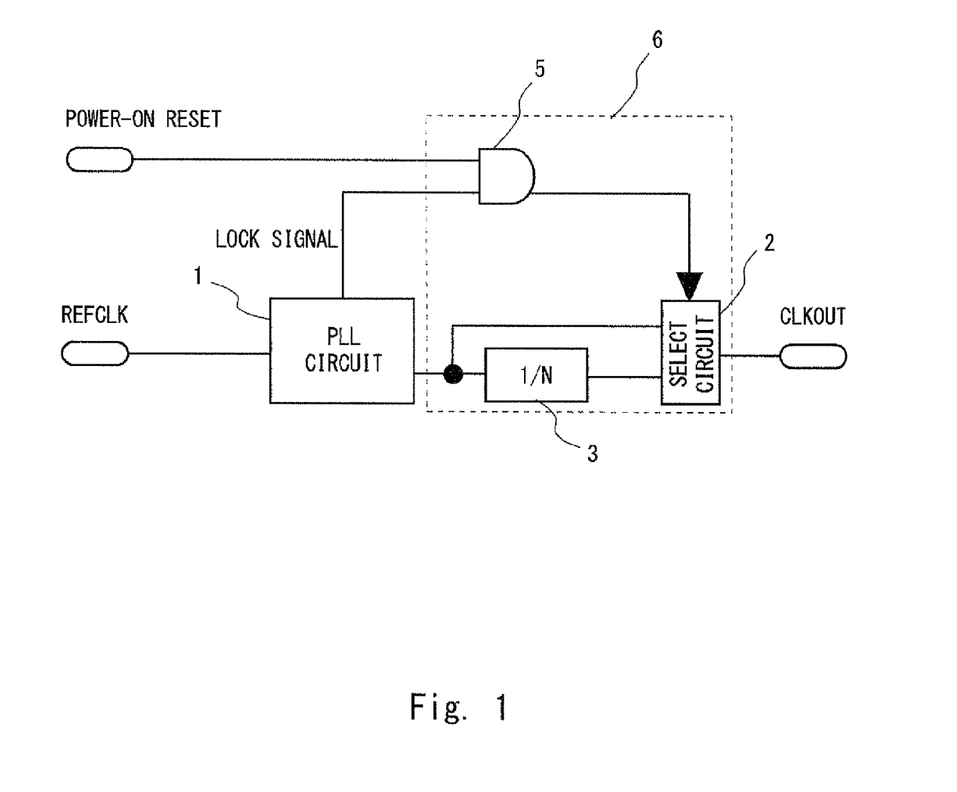
FIG. 1 is a circuit configuration diagram according to an exemplary embodiment of the present invention.

Exemplary embodiments according to the present invention are explained hereinafter with reference to the drawings. FIG. 1 is a circuit configuration diagram according to an exemplary embodiment of the present invention. As shown in FIG. 1, a clock signal initialization circuit according to an exemplary embodiment of the present invention includes a PLL circuit 1, a select circuit 2, a 1/N frequency division circuit 3 (the value N is described later), an AND gate (logical multiplication calculation unit) 5. In FIG. 1, a controller 6 includes the select circuit 2, the 1/N frequency division circuit 3, and the AND gate 5. The controller 6 realizes a function of deriving a clock signal having a frequency no greater than a maximum permissible frequency that is determined based on the power consumption of a semiconductor integrated circuit as an operation clock signal CLKOUT (supply clock signal) for the semiconductor integrated circuit at least until the PLL circuit 1 becomes a locked state after the power-on.

The PLL circuit 1 generates a clock signal that synchronizes with an externally-supplied reference clock signal REFCLK and outputs the generated clock signal as an operation clock signal CLKOUT for a semiconductor integrated circuit (not shown).

The PLL circuit 1 is configured in such a manner that when the PLL circuit 1 is in a state where a clock signal synchronized with the reference clock signal REFCLK is generated, a lock signal for indicating a locked state becomes an enabled state. A method for generating such a lock signal is well known, and therefore its explanation is omitted here.

The AND gate 5 receives this lock signal and an externally-supplied power-on reset signal, and calculates the logical multiplication of both signals. The AND gate 5 generates a select control signal so that the select circuit 2 operates in the following manner: in a power-on reset period or in a state where the lock signal is in a disabled state, the select circuit 2 selects the output of the 1/N frequency division circuit 3; and when the power-on reset signal is disabled and thus the lock signal becomes an enabled state, the select circuit 2 selects the output of the PLL circuit 1.

In this example, the 1/N frequency division circuit 3 divides the frequency of the output of the PLL circuit. Further, its frequency division ratio N is set in advance to such a value that the operation clock signal CLKOUT, i.e., the operating frequency of the semiconductor integrated circuit does not exceed the maximum permissible frequency that is determined based on the power consumption of the semiconductor integrated circuit when the PLL circuit 1 is operating at the maximum oscillating frequency. As a result, the operation clock signal CLKOUT never exceeds that maximum frequency even when the PLL circuit 1 is still in a start-up state, and thus in an unlocked and transient state.

Figure 2:
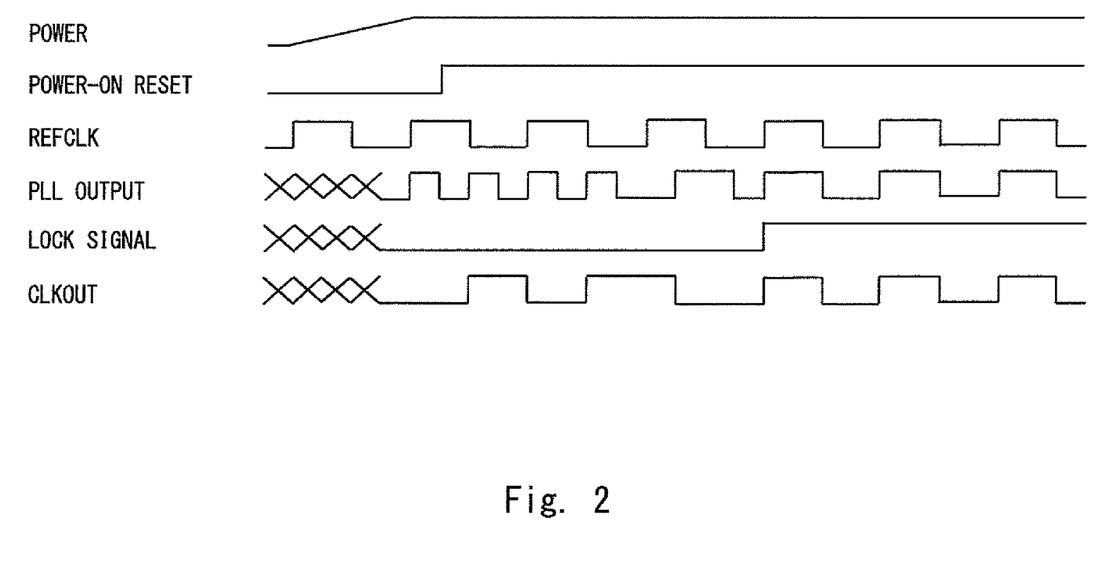
FIG. 2 is a timing chart showing an operation according to an exemplary embodiment of the present invention.

FIG. 2 is a timing chat showing an operation according to the exemplary embodiment of the present invention shown in FIG. 1. When the semiconductor integrated circuit is powered on, a power-on reset period starts and continues for a predetermined period, during which the power-on reset signal remains at a low level. After that, the power-on reset signal changes to a high level.

Meanwhile, the PLL circuit 1 starts to operate upon the power-on, and the lock signal remains in a disabled state (low level) until the output of PLL circuit is fixed. Then, when the output of the PLL circuit 1 is fixed and thus the PLL circuit 1 becomes a locked state, the lock signal becomes an enabled state (high level).

Therefore, until the output of the PLL circuit 1 is stabilized and thus the lock signal becomes an enabled state (high level) after the power-on and the subsequent start-up, the output of the AND gate 5 is kept at a low level by the low level(s) of the power-on reset signal and the lock signal. As a result, the AND gate 5 controls the select circuit 2 so as to select the output of the 1/N frequency division circuit 3. Consequently, even if the PLL circuit in the unlocked state transiently outputs a clock signal having a high frequency, this clock signal having a high frequency never propagates directly to the operation clock signal CLKOUT because of the frequency division operation by the 1/N frequency division circuit 3.

After that, when the PLL circuit 1 synchronizes with the reference clock signal REFCLK and thereby generates a stable clock signal, the lock signal becomes an enabled state (high level). Therefore, the output of the AND gate 5 becomes a high level and thereby controls the select circuit 2 so as to select the output of the PLL circuit 1. Therefore, after that, the stable output of the PLL circuit is derived as the operation clock signal CLKOUT.

Figure 3:
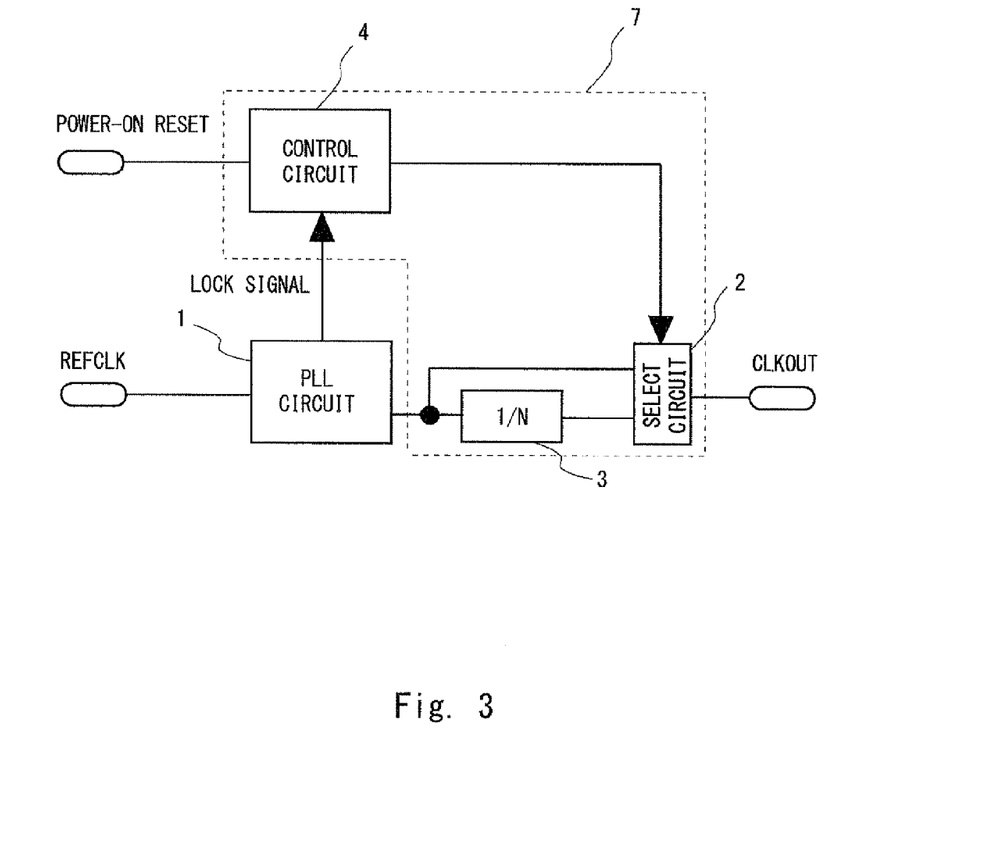
FIG. 3 is a circuit configuration diagram according to another exemplary embodiment of the present invention.

FIG. 3 shows another exemplary embodiment according to the present invention, in which the equivalent components/parts to those in FIG. 1 are denoted by the same symbols. As shown in FIG. 3, a clock signal initialization circuit in this example controls the select control performed by the select circuit 2 by using the power-on reset signal and the lock signal of the PLL circuit 1. Therefore, this clock signal initialization circuit includes a control circuit 4. For example, the control circuit 4 includes means (calculation unit) for performing a logical operation of the power-on reset signal and the lock signal for indicating a locked state. In FIG. 3, a controller 7 includes the select circuit 2, the 1/N frequency division circuit 3, and the control circuit 4. The controller 7 realizes a similar function to that of the controller 6 shown in FIG. 1.

Figure 4:
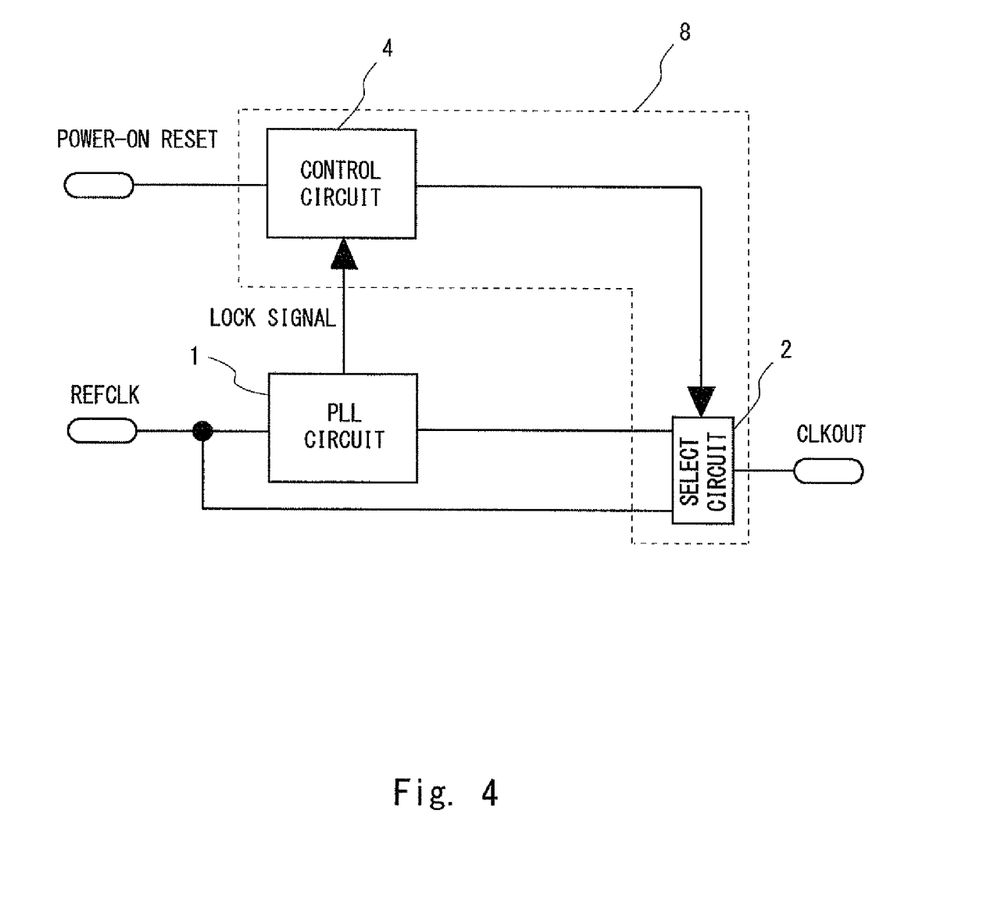
FIG. 4 is a circuit configuration diagram according to another exemplary embodiment of the present invention.

Further, as shown in FIG. 4, needless to say, the reference clock signal REFCLK may be used instead of the 1/N frequency division circuit 3 shown in FIG. 1 or 3. For example, the control circuit 4 includes means (calculation unit) for performing a logical operation of the power-on reset signal and the lock signal for indicating a locked state. In FIG. 4, a controller 8 includes the select circuit 2 and the control circuit 4. The controller 8 realizes a similar function to that of the controller 6 shown in FIG. 1.

In each of the above-described exemplary embodiments, the select circuit 2 performs the switching immediately after the lock signal becomes an enabled state. However, the select circuit 2 may perform the switching after a fixed time has elapsed after the the lock signal becomes an enabled state. For example, in FIGS. 3 and 4, the control circuit 4 may be configured in such a manner that the select circuit 2 selects the clock signal output from the PLL circuit 3 after a fixed time has elapsed after the the lock signal becomes an enabled state. In an example, the control circuit 4 may include a logical multiplication circuit and a delay element, and may be configured in such a manner that after the logical multiplication circuit performs a logical operation of the power-on reset signal and the lock signal, the result of the logical operation (result signal) is output to the select circuit 2 after an arbitrary time has elapsed by the delay element.

Further, it is also obvious that instead of the 1/N frequency division circuit 3, an oscillator having a frequency equal to or less than the operating frequency of the semiconductor integrated circuit generated by the PLL circuit 1 may be separately provided, and the output of this oscillator may be selected and supplied to the semiconductor integrated circuit at least until the PLL circuit becomes a locked state.

Note that as example technical fields in which the present invention can be used, the present invention can be applied to a large-scale (large power consumption) digital semiconductor integrated circuit or the like that operates in synchronization with a clock signal generated by using a PLL circuit.

According to the present invention, there is an advantageous effect that it is possible, in the initialization process of a semiconductor integrated circuit that operates in synchronization with a clock signal generate by a PLL circuit, to reliably prevent the operating frequency of the semiconductor integrated circuit from exceeding the maximum permissible frequency that is determined based on the power consumption of that semiconductor integrated circuit even when the PLL circuit is still in a start-up state, and thus in an unlocked and transient state.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A clock signal initialization circuit comprising:
a PLL circuit that generates a clock signal and outputs the generated clock signal as an operation clock signal fora semiconductor integrated circuit, the generated clock signal being synchronized with an externally-supplied reference clock signal; and
a controller that derives a clock signal having a frequency no greater than a maximum permissible frequency determined based on a power consumption of the semiconductor integrated circuit as the operation clock signal until the PLL circuit becomes a locked state after power-on,
wherein the controller selects the clock signal either as a frequency division of an output of the PLL circuit and the externally-supplied reference clock signal when the PLL circuit is in an unlocked state, or selects the clock signal as an output of the PLL circuit when the PLL circuit is in a locked state.

2. The clock signal initialization circuit according to claim 1, wherein
the controller comprises a calculation unit that performs a logical operation of a power-on reset signal and a lock signal for indicating the locked state, and a selector that selects the clock signal having a frequency no greater than the maximum permissible frequency according to an output of the logical operation.

3. The clock signal initialization circuit according to claim 1, wherein the controller derives the clock signal having the frequency no greater than the maximum permissible frequency based on a power-on reset signal and a lock signal for indicating the locked state.

4. The clock signal initialization circuit according to claim 3, wherein the controller comprises a calculation unit that performs a logical operation of a power-on reset signal and a lock signal for indicating the locked state, and a selector that selects the clock signal having a frequency no greater than the maximum permissible frequency according to an output of the logical operation.

5. A clock signal initialization method for a semiconductor integrated circuit that operates in synchronization with a clock signal generated by a PLL circuit, the clock signal initialization method including deriving a clock signal having a frequency no greater than a maximum frequency as a supply clock signal to the semiconductor integrated circuit at least until the PLL circuit becomes a locked state after power-on,
wherein a controller selects the clock signal either as a frequency division of an output of the PLL circuit and an externally-supplied reference clock signal when the PLL circuit is in an unlocked state, or selects the clock signal as an output of the PLL circuit when the PLL circuit is in a locked state.

6. The clock signal initialization method according to claim 5, wherein the deriving includes performing a logical operation of a power-on reset signal and a lock signal for indicating the locked state, and selecting the clock signal having a frequency no greater than the maximum frequency according to an output of the logical operation.

7. The clock signal initialization method according to claim 5, wherein in the deriving, the clock signal having the frequency no greater than the maximum frequency is derived based on a power-on reset signal and a lock signal for indicating the locked state.

8. The clock signal initialization method according to claim 7, wherein the deriving includes performing a logical operation of a power-on reset signal and a lock signal for indicating the locked state, and selecting the clock signal having a frequency no greater than the maximum frequency according to an output of the logical operation.

9. A clock signal initialization circuit for a semiconductor integrated circuit that operates in synchronization with a clock signal generated by a PLL circuit, the clock signal initialization circuit comprising;
   a controller that derives a clock signal having a frequency no greater than a maximum permissible frequency determined based on a power consumption of the semiconductor integrated circuit as a supply clock signal to the semiconductor integrated circuit at least until the PLL circuit becomes a locked state after power-on,
   wherein the controller derives one of the clock signal obtained by dividing a frequency of an output of the PLL circuit and an externally-supplied reference clock signal when the PLL circuit is in an unlocked state, and derives an output of the PLL circuit when the PLL circuit is in a locked state.

* * * * *